United States Patent [19]

Cheema et al.

[11] 4,304,836
[45] Dec. 8, 1981

[54] SURLAY PROOFING METHOD

[75] Inventors: Zafarullah K. Cheema, Morristown; Oliver A. Barton, Florham Park, both of N.J.

[73] Assignee: American Hoechst Corporation, Somerville, N.J.

[21] Appl. No.: 803,355

[22] Filed: Jun. 3, 1977

Related U.S. Application Data

[63] Continuation-in-part of Ser. No. 619,285, Oct. 3, 1975, abandoned, which is a continuation of Ser. No. 474,249, May 29, 1974, abandoned.

[51] Int. Cl.³ .............................................. G03C 11/12
[52] U.S. Cl. ..................................... 430/252; 430/293; 430/329; 430/358
[58] Field of Search ...................... 96/14, 15, 28, 35.1; 430/252, 293, 329, 358

[56] References Cited

U.S. PATENT DOCUMENTS

| | | | |
|---|---|---|---|
| 3,130,050 | 4/1964 | Schwerin | 96/35.1 |
| 3,481,736 | 12/1969 | Ruff | 96/28 |
| 3,533,796 | 10/1970 | Lassig et al. | 96/28 |
| 3,639,123 | 2/1972 | Gray | 96/28 |
| 3,671,236 | 6/1972 | Van Beusekon | 96/15 |
| 3,721,557 | 6/1973 | Inoue | 96/28 |
| 3,796,578 | 3/1974 | Hosoi et al. | 96/115 R |

Primary Examiner—Jack P. Brammer

[57] ABSTRACT

A process for making a multicolored reproduction combining overlay and surprint characteristics in which a photohardenable layer, such as a photopolymerizable layer, is cast on a semi-rigid, transparent, support film, the photohardenable layer is exposed in an appropriate exposure unit through a color negative representing one color, the exposed layer is developed to remove the unexposed areas and leave the exposed image areas, an adhesive layer, such as an acrylic adhesive, is coated on a release sheet, the coated release sheet is contacted with a receptor sheet at a temperature and pressure sufficient to transfer the adhesive to the sheet, the developed layer is contacted with the adhesive coated sheet at a temperature and pressure sufficient to transfer the image areas to the sheet and the steps of casting a photohardenable layer, exposing the layer, developing the layer and contacting the image areas with the sheet is repeated for each additional color desired.

13 Claims, 9 Drawing Figures

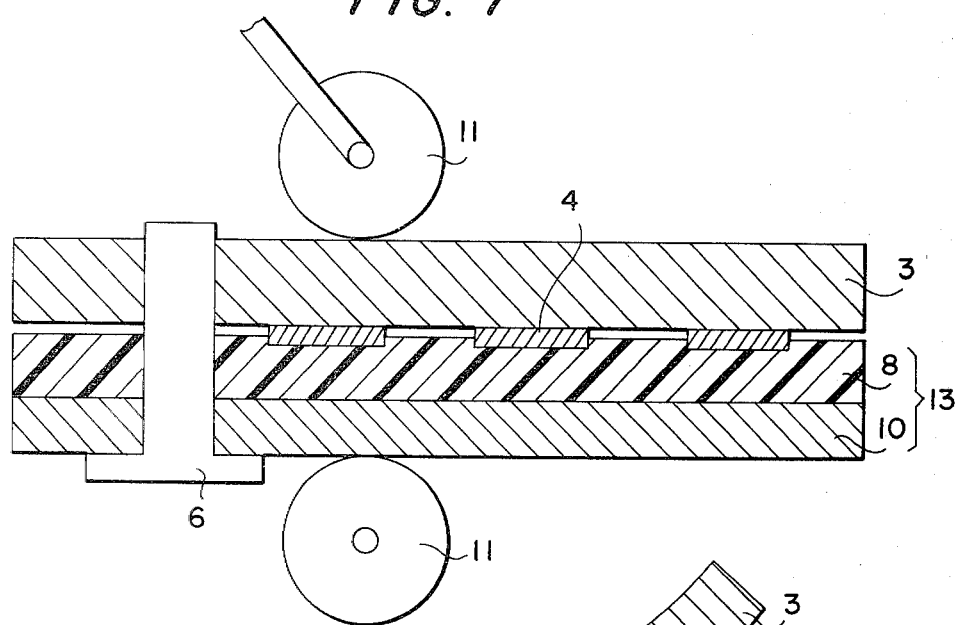
FIG. 7
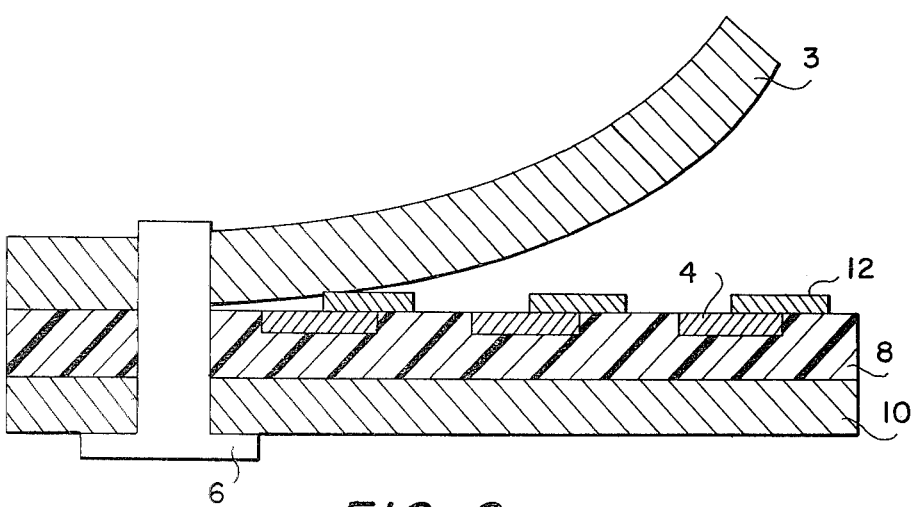
FIG. 8
FIG. 9

SURLAY PROOFING METHOD

This application is a continuation-in-part of application Ser. No. 619,285, filed Oct. 3, 1975, now abandoned, in turn a continuation of application Ser. No. 474,249, filed May 29, 1974, and now abandoned.

This invention relates to a process for making a multicolored reproduction combining overlay and surprint characteristics.

BACKGROUND AND PRIOR ART

In the graphic arts, it is desirable to produce a four or more color proof to assist a color etcher in correcting a set of color prints prior to using them to produce color plates and also to reproduce the color quality that will be obtained during the printing process. The proof must be a consistent duplication of the half tone, and should neither gain nor lose color. Visual examination of a color proof should show the following characteristics:
1. Defects on the negative.
2. The best color rendition to be expected from press printing of the material.
3. The correct gradation of all colors and whether grays are neutral.
4. The need, if any, for subduing one of the colors and/or giving directions for altering the film negatives before making the printing plates.

A method of transferring colored images has been applied to the preparation of a color proofing sheet in multicolor printing. Thus, color proofing sheets, for multi-colored printing, have heretofore been made by using a printing press or a proof press while taking all the steps necessary for actual multicolor printing, but such a conventional method of color proofing has been costly and time consuming.

Photographic processes have also been used, especially photographic processes using photopolymers. There are two known types of photographic color proofing methods; namely, the surprint type and the overlay type.

In the overlay type of color proofing method, an independent transparent plastic support is used for producing a print of each color separation film by applying a photosensitive solution of the corresponding color, and a plurality of such supports carrying prints of corresponding colors are then superposed upon each other on a white sheet to produce a color proofing sheet. The overlay type of color proofing method has the disadvantage that the superposed plastic supports tend to darken the color proofing sheet, and, as a result, the impression of the color proofing sheet thus prepared becomes vastly different from copies actually obtained by a conventional printing press or a proof press. Its primary advantage is that it is quick and can serve as a progressive proof by combining any two or three colors in register.

In the known surprint type of color proofing method, a color proofing sheet is prepared by successively producing prints of different colors from different color separation films, respectively, by utilizing a single opaque support by applying toners, or by applying photosensitive solutions or coatings of photopolymers of corresponding colors on the opaque support in succession. Examples of some of these approaches are: U.S. Pat. No. 3,671,236 (317)-Transfer color key and U.S. Pat. No. 3,136,637 (3M)-Color key. An advantage of the surprint type of color proof is that the color saturation is not influenced by the plastic support. This method more closely resembles the actual printing process and eliminates the color distortion inherent in the overlay system.

Various processes for producing copies of an image embodying photopolymerization and thermal transfer techniques are known. See U.S. Pat. Nos. 3,060,023; 3,060,024; 3,060,025; 3,481,736; and 3,607,264. In these processes, a photopolymerizable layer coated on a suitable support is exposed, imagewise, to a process transparency. The surface of the exposed layer is then pressed into contact with the image receptive surface of a separate element and at least one of the said elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter adheres, preferentially, to the clear unpolymerized material. The lamination, exposure, and development steps are carried out for the respective colors, in sequence, thus making these processes time consuming.

U.S. Pat. No. 3,574,049 (1971), issued to Trentesaux-Toulemonde, provides a transfer process, wherein it is stated:

"The present invention provides a transfer process for printing a design on a final support which comprises (a) printing a design onto a temporary support, (b) super-imposing the temporary support and the final support, (c) applying heat and/or pressure to the superimposed structure formed in (b), and (d) separating the temporary support from the final support which retains the printed design, the affinity of the mater of the design for the temporary support being lower than its affinity for the final support."

"The temporary support may comprise a coating, called a transfer coating, of a material for which the material of the design has an affinity lower than its affinity for the final support, and preferably the difference between the two affinities also increases with increasing temperature."

In the claims, the temporary support is coated on its face with a transfer coating (a release layer) of ethylcellulose which bears a pigmented film of vinylchloride polymers or copolymers. The teachings of the above patent allow only (a) a single transfer which is not feasible for multiple transfer, (b) transfer of vinylchloride polymer systems only are possible, and (c) the transfer is made possibe by a thermally sensitive release layer present between the image and the support. Futhermore, this process is not photographic, but relies upon impression printing. Finally, the polyvinylchloride printed image is transferred only to metallic aluminum. No reference is made to transfer papers or plastics.

In U.S. Pat. No. 3,721,557, issued to Process Shizai Co., Ltd., Tokyo, Japan, a method of transferring colored images is claimed which provides a stripping layer coated between the photosensitive element and the support. When the photosensitive layer is exposed to actinic light and developed, the more soluble portions are selectively removed to produce a visible image. The image-carrying support is pressed against a suitable adhesive coated receptor member and, subsequently, the carrier support sheet is stripped to accomplish the transfer of the image. A fresh layer of adhesive is applied to the receptor for each subsequent transfer. The two extra steps (1) of coating a stripping layer between the photosensitive coating and the support, and (2) application of adhesive between each image, are time-consuming and costly. In addition, the image build-up in a four-color proof is so thick that it gives rise to moire patterns and secondly the image is so distorted that the proof cannot be any cleaner or truer than an overlay proof.

Most of the cited processes are positive working systems. Some require costly and sophisticated transfer equipment and depend on sequential lamination (pressure and heat), exposure, and transfer (or delamination of the polymeric element) processes for each color used. This, of course, makes the total process very time consuming. The use of addition polymerizable elements for the production of relief images was first revealed by Gates (British Pat. No. 566,795—1945) but this invention was not found to be practical. Photopolymer elements of a more practical and preferred type relating to this invention are disclosed in Plambeck, U.S. Pat. Nos. 2,760,863 (1956); 2,791,504 (1957); 3,218,167 (1965); 3,458,311 (1969); Giangualano et al, U.S. Pat. No. 3,376,139 (1968); and Eastman Kodak Company U.S. Pat. Nos. 2,697,039 (1954); 3,497,356 (1970); and 3,519,424 (1970).

Finally, U.S. Pat. No. 3,775,113, issued to Bonham et al, covers a process for transferring positive images to receptor sheets. It should be noted here, that this process is for positive-working systems rather than negative-working systems and the photosensitive materials utilized are photolyzable rather than light-hardenable. In fact, it is stated in the patent that "A further objection to processes utilizing transfer sheets having a free radical photopolymerizable layer is that such layers are susceptible to oxygen inhibition and must be protected by a cover sheet or protective layer."

The distinguishing features of our invention, as will be shown in more detail below in the description of the invention, however, are that the unexposed negative-working, photosensitive layer is not thermally transferrable and the exposed and developed negative-working, photosensitive layer is thermally transferrable without the aid of a stripping layer between the negative-working, photosensitive layer and the carrier sheet.

One objective of this invention is to utilize a truly negative-working system in which color separation negatives are used for the exposure step and the light-exposed images obtained are composed of light hardened matter.

A further objective, when using photopolymerizable layers, is to expose the light sensitive coatings through the transparent polyester support in such a way as to produce a thin layer of crosslinked coating next to the support sheet and overlaid with enough uncrosslinked coating, or other oxygen impervious coating, so that polymerization of the light sensitive coating may proceed.

Another objective of this invention is to provide a new and practical process for transferring multicolored photopolymerized images from transparent overlay foils to a receptor sheet, using but one layer of adhesive, regardless of the number of colored images so transferred.

A still further objective of this invention is to carry out the transfer process, under pin register, and at a low uniform pressure and temperature so that high resolution of the image is obtained.

Another objective is to permit the use of any water resistant sheet or foil as a suitable carrier overlay, wherein the proper image adhesion is obtained both before and after development.

A further objective is to provide a suitable adhesive transfer process so that even porous paper may be used for the receptor sheet without starving the surface for adhesive.

Still further objects will be apparent from the description of the invention.

SUMMARY OF THE INVENTION

In the use of photopolymerizable compositions, a colored photosensitive layer is cast on a semi-rigid, transparent, support film. The layer consists of:

a. at least one organic macromolecular binder, with pendant acid groups, b. at least one multi-functional, unsaturated, compound capable of forming a polymer by addition polymerization, usually called monomer, c. an addition polymerization initiator activated by radiation, d. a light stable colorant taken from the class of light stable dyes or pigments. The colorant should be one such that when it is transferred to the receptor, its color values approximate the color values that will be produced by the printing ink that is to be used. Under these conditions, the color proof will simulate the true printing, e. optionally, a sensitomeric regulator, f. and, optionally, a hydrogen donor. The coating is cast at a coating weight of between 2 and 20 g/m$^2$, preferably 4.0–10.0 g/m$^2$. It is then dried at 40°–100° C. in an air oven for an interval of time until the coating is dry to touch. The dry coating may then be left as is or overcoated with a dilute water solution of polyvinyl alcohol or some equally satisfactory oxygen barrier system. The coating is then exposed to UV radiation in a typical exposure unit. It is exposed through the appropriate color negative, which is placed on the film side (support side) of the composite. The exposed coatings are developed with an aqueous alkali developer, washed with water, and dried. The above steps are repeated as often as necessary with differently colored elements ultimately leading to a multicolored overlay system. An acrylic hot melt adhesive is coated upon a suitable support sheet by means known to the art. Then, the image bearing support film is brought together with the adhesive coated, support sheet (image to adhesive) again under nominal pressure and at elevated temperature. The composite is cooled before stripping away the overlay film leaving the image embedded in the adhesive on the receptor sheet. Alternatively the image layer first to be transferred to the receptor sheet is coated with a layer of adhesive. Each additional image is registered on the preceeding image and transferred in the same manner. No additional adhesive layers are used or necessary. The original layer of adhesive suffices for the entire series of image transfers.

BRIEF DESCRIPTION OF THE DRAWINGS

FIG. 7 shows lamination of the paper stock to the developed base sheet, FIG. 8 shows the base sheet being peeled off the paper stock to transfer the image areas to the paper stock, and FIG. 9 shows a second base sheet being peeled off the paper stock to transfer a second color image area to the paper stock.

DETAILED DESCRIPTION OF THE INVENTION

Figure 1:
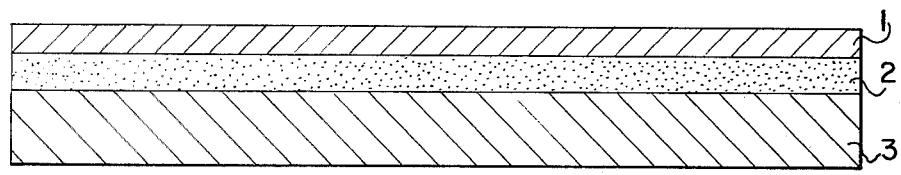
FIG. 1 shows a coated base sheet.

In general, this invention comprises an image reproduction and transfer process in which an element is produced comprising, in order, (a) a carrier support, (b) a photohardenable layer, preferably including a photopolymerizable layer, and (c) an adhesive coated receptor sheet ultimately laminated to the photohardened layer on the carrier support.

The term "photopolymerizable", as used herein, refers to systems in which the molecular weight of at least one component of the photosensitive layer is increased by exposure to actinic radiation sufficiently to result in a change in the rheological and thermal behavior of the exposed areas. Those photopolymerizable systems found suitable for this use (1) may be present alone or in combination with a compatible binder or (2) such a photohardenable group may be attached to a polymer backbone. The group becomes activated on exposure to light and may then crosslink by reacting with a similar group or other reactive sites on adjacent polymer chains. Where the pendent photohardenable group is capable of addition polymerization, the total chain may involve addition of many units initiated by a single photochemical act or as few as two units to form what is known as a dimer. Where a photohardenable molecule has more than one reactive site, a socalled crosslinked network of molecules is produced.

The term "exposed" as used in this invention is intended to cover the image areas whose solubility in water and weak alkali is significantly less because of the actinic light-induced increase in molecular weight of the photohardenable molecule, thus allowing the unexposed or partially exposed areas to be removed by greater solubility in water or weak alkali.

In the preferred photopolymer image reproduction element, the carrier support should be a material which is chemically and thermally stable under the process conditions of the invention, flexible and transparent to actinic light. Thin films of polyethylene terephthalate have been found most acceptable. However, copolymers and terpolymers of methyl methacrylate, modified celluloses, 6,6 Nylons, 6,12 Nylon, 6 Nylon, polyvinyl acetates and alcohols may be used.

The composition of the binder-, monomer-, initiator-, colorant-, light-sensitive-coating may be selected from the following components but is not necessarily limited to the named materials:

Binders:
  Composition
  MMA/MAA (90/10)
  MMA/MAA (85/15)
  HEMA/St/MAA (72/10/18)
  HEMA/St/MAA (60/10/30)
  HEMA/St/MAA (55.6/12.7/31.7)
  MMA/HEMA/MAA (12.5/62.5/25)
  MMA/EA/MAA (75/10/15)
  MMA/EA/MAA (65/20/15)
  MMA/BA/MAA (65/20/15)

MMA=Methyl methacrylate; EA=Ethyl acrylate; St=Styrene; BA=Butyl acrylate;
HEMA=Hexyl methacrylate; MAA=Methacrylic acid.

The preferred binders have an acid number between 30 and 200 (preferably 80–200) and a viscosity, at 25% solids in ethyl cellusolve, of 75 cps to 200 cps (preferably 100–150 cps) at 22° C. (Cannon-Fenske method-C-661 tube). These compositions are partially thermoplastic. These binders may be present in the photohardenable layer in the range of about 35 to 75% by weight based upon the weight of the total composition, and preferably in the range of about 40 to 70% by weight.

Light Sensitive Monomers:

Suitable ethylenically unsaturated compounds which may be used in this invention include unsaturated esters of polyols, particularly such esters of the alpha methylene carboxylic acids, e.g. ethylene diacrylate, diethylene glycol diacrylate, glycerol triacrylate, mannitol polyacrylate, polyacrylates, ethylene dimethacrylate, 1,3 propanediol dimethacrylate, polyethylene glycol dimethacrylate, 1,2,4 butanetriol trimethacrylate, trimethylol ethane triacrylate, 1,4 benzenediol dimethacrylate, pentaerythritol di-, tri-, and tetramethacrylate, pentaerythritol di-, tri- and tetra-acrylate, dipentaerythritol polyacrylate, 1,3 propanediol diacrylate, 1,5 pentanediol dimethacrylate, the bis acrylates and methacrylates of polyethylene glycols of molecular weight 200–400 and the like; unsaturated amides, ethoxylated bisphenol A, particularly those of the alpha methylene carboxylic acids, alpha, omega diamines and oxygen interrupted omega diamines, such as methylene bisacrylamide, and ethylene bis-methacrylamide. The preferred monomeric compounds have more than one ethylenically unsaturated group. The amount of monomer added varies with the particular binder used.

These monomers may be present in the photohardenable layer in the range of about 30 to 55% by weight based upon the weight of the total composition, and preferably in the range of about 40 to 50% by weight.

Initiators:

A preferred class of addition polymerization initiators, activatable by actinic light and thermally inactive at and below 150° C. are the substituted or unsubstituted polynuclear quinones, which compounds have two intracyclic carbonyl groups attached to intracyclic carbon atoms in a conjugated six membered carbocyclic ring, there being at least one aromatic carboxylic ring fused to the ring containing the carbonyl groups. Suitable such initiators include 9,10-anthraquinone, 1-chloroanthraquinone, 1,4-naphthoquinone, 2,3-benzanthraquinone, 2,3-diphenylanthraquinone, and 1,2,3,4-tetrahydrobenzanthracene-7,12-dione. Other photoinitiators that are useful in this process are diacetyl benzil, benzoin, 9-phenylacridine, 2,3-diparamethoxy phenyl quinoxaline, diacetyl benzil, and benzoin methyl or ethyl ethers. The initiators of this invention are most effectively activated by light of about 300 to 500 nanometers wavelength. Still other initiators may be used without departing from the spirit of this invention. These initiators may be present in the photohardenable layer in the range of about 0.5 to 2.0% by weight based upon the weight of the total composition, and preferably in the range of about 1.0 to 1.7% by weight.

Colorants:

The colorants used may be either pigments or dyes. If pigments are used, these are best incorporated into the coating formulation by ball milling the pigment and appropriate wetting agents into the base film forming resin, then adding this concentrate, with stirring, to the coating formulation. Suitable pigments are Royal Spectra Black (City Service Company), Yellow DGH 23 (American Hoechst Corporation), Hostaperm Pink E (American Hoechst Corporation), Permanent Blue 15-1020 (American Hoechst Corporation), etc. Among the dyes that are suitable are:

Victoria Pure Blue FGA-BASF
Rhodamine 6 GDN Extra-Dupont
Interplast Pink 5 BLG-Intracolor
Auramine 0 Concentrate-BASF
Hostadye Yellow Fast R-American Hoechst Corporation
Neozapon Fiery Red G-BASF
Atlantic Brown #4-Atlantic Chemical Company
Neozapon Red BE-BASF
Grasol Fast Yellow 3 GL-Ciba-Geigy
Grasol Fast Black RL-Ciba-Geigy
Grasol Fast Rubine 2 BL-Ciba-Geigy
Spirit Black #3-Dupont
Crystal Violet 6B-Dye Specialties Corporation
Crystal Violet Base-Kalle AG
Acetasol Green BLS
Neozapon Red BB-BASF
Astra Malachite Green Crystals-Verona Dye Co.
Neozapon Yellow GG-BASF
Astrazon Blue FFR-Verona Dye Co.
Spirit Soluble Fast Yellow R-BASF
Astrazon Red GTL-Verona Dye Co.
Rhodamine B Extra-Dupont
Basic Black KOR-Allied
Victory Blue B-Dupont
Victory Cyan-BASF
Astrazon Red GB Base-Verona Dye Co.
Auramine-Dupont
Astrazon Red BBL Base-Verona Dye Co.
Astrazon Black R-Verona Dye Co.
Astrasol Yellow Brown-2 GL-Verona Dye Co.
Astrazon Orange R-Verona Dye Co.
Grasol Fast Pink 5 BL-Ciba-Geigy
Solvent Black DS-2906-Dye Specialties
Astrazon Black WRL-Verona Dye Co.
Astrazon Pink FBB Base-Verona Dye Co.

Dyes and pigments may be selected to match printing inks. These colorants may be present in the photohardenable layer in the range of about 5 to 10% by weight based upon the weight of the total composition, and preferably in the range of about 6 to 9% by weight.

Sensitometric Regulators:

The sensitometric regulators used in this invention may be selected from the substituted benzophenones. They are compatible with either the components of the light sensitive coating system or, in some cases, may be included in the protective coating of a polymeric release layer. They have relatively high melt temperatures (100° C.–350° C.) and inhibit long term degradation of the print. Those inhibitors that may be used are 2,2'-dihydroxyl-4,4'-tetrahydroxybenzophenone, 2-hydroxy-4-methoxy-benzophenone-5-sulfonic acid and sodium 2,2'-dihydroxy-4,4'-dimethoxy-5-sulfobenzophenone. One may also use the alkylated phenols and bisphenols, such as the Irganox 1076 and 1093 (Ciba-Geigy), the Ionols CP and CP40, and the Advastalis 401 and 402 (Deutsche Advance Production). These sensitometric regulators may be present in the photohardenable layer in the range of about 0.1%–1.0% by weight based upon the weight of the total composition, and preferably in the range of about 0.3–0.8% by weight.

Hydrogen Donors:

The hydrogen donors used in this invention are added for the purpose of improving the efficiency of the initiator which, in turn, improves the polymerization rate of the monomer. Among those compounds found useful for this purpose, in this invention, are hexyl diethylene glycol ether, methyl phthalyl ethyl glycolate, and ethyl phthalyl ethyl glycolate. However, these additives do not appear to noticeably affect the efficiency of faster initiators. These hydrogen donors may be present in the photohardenable layer in the range of about 2.0 to 5.0% by weight based upon the weight of the total composition, and preferably in the range of about 3.0 to 4.0% by weight.

Support Layers:

As support layers, conventional sheet materials may be used including paper, metal and plastics. Among these, paper is normally preferred but, depending upon economics, physical characteristics and purposes intended, any one may be chosen.

Adhesives:

Adhesives for coating the image receptor sheet, used in this invention, are of the clear to slightly translucent hot melt type and are activated at temperatures of between 200° F.–260° F. and laminator roll pressures of 20 psi–500 psi. Preferred molecular weights of the adhesives are between 10,000 and 50,000 and show viscosities (ASTM-D-2857-Dilute Solution Viscosity of Polymers-Cannon-Fenske Tube C-661) at 25% solids in ethyl cellosolve of 80 cps–170 cps. Among those polymeric materials found suitable for the purpose of this invention are: Methyl methacrylate/methacrylic acid copolymers (90/10 pts by weight-70/30pts by weight), Hexyl methacrylate/styrene/methacrylic acid (72/10/18), methyl methacrylate/hexyl methacrylate/methacrylic acid (12.5/62.5/25), methyl methacrylate/ethyl acrylate/methacrylic acid (75/10/15), methyl methacrylate/ethyl acrylate/methacrylic acid (65/20/15). Also, Rohm & Haas' Acryloid resins may be used: they are Acryloids F-10, B-82, B-72, B-66, B-48 N and A-10 and are believed to be butyl methacrylate polymer, methyl methacrylate copolymer, ethyl methacrylate copolymer, methyl butyl methacrylate copolymer, methyl methacrylate copolymer and methyl methacrylate polymer, in that order. These materials may be used singly or in combination. Other similar polymers may be used for this purpose without departing from the scope and intent of this invention.

The adhesive may be coated on the surface of the sheet at a weight of about 15 to 25 grams per square meter, preferably 18 to 22 grams per square meter. The total coating weight of adhesive actually applied will depend upon the porosity of the sheet, as is known in the art. Thus, in the case of a highly porous paper sheet, the first portion of the adhesive laid down is consumed in filling the pores and sealing the surface of the sheet. Accordingly, in this case, more than 25 grams per square meter of adhesive may be required.

Figure 2:
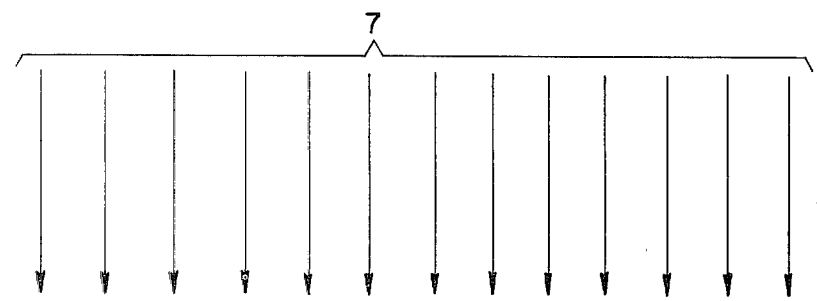
FIG. 2 shows exposure of the base sheet through a negative.
Figure 3:
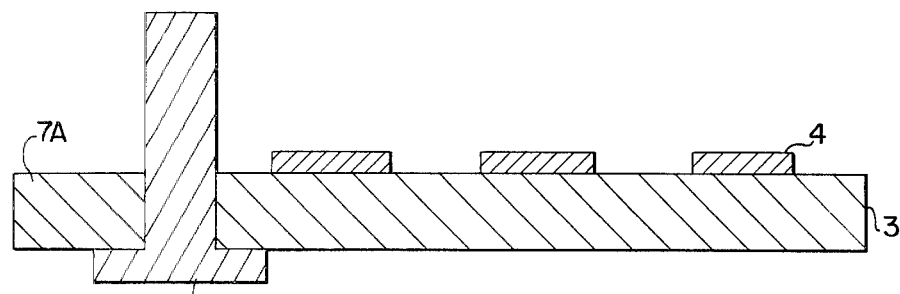
FIG. 3 shows the hardened image areas on the base sheet after removal of the unhardened non-image areas.
Figure 4:
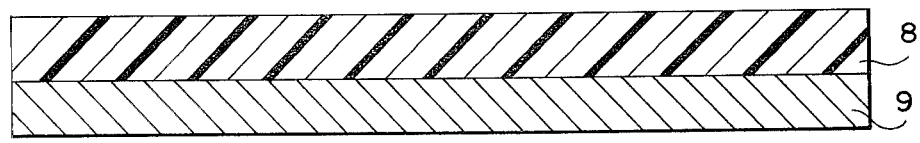
FIG. 4 shows a release sheet with adhesive.
Figure 5:
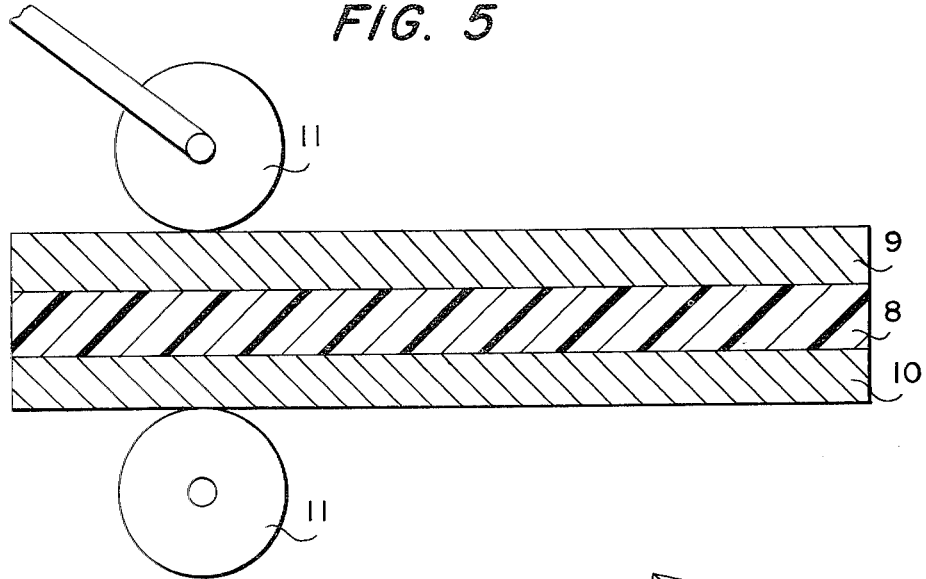
FIG. 5 shows lamination of the release sheet to paper stock.
Figure 6:
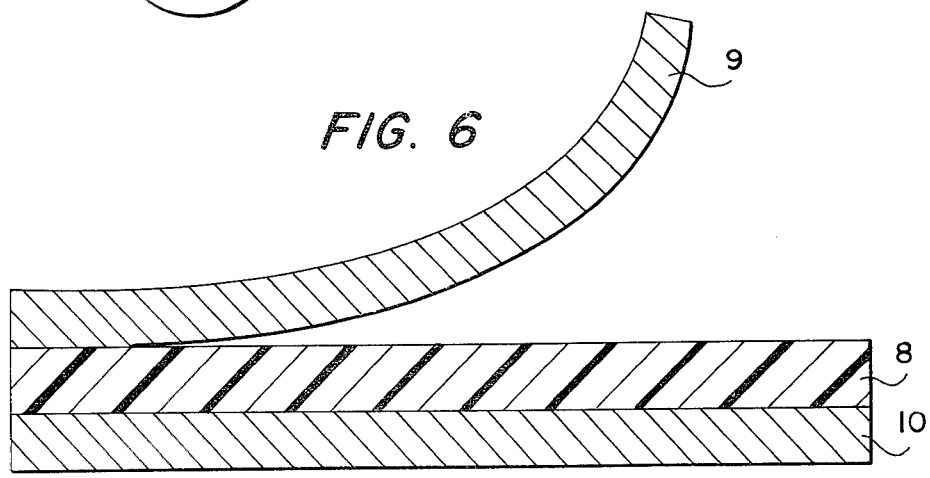
FIG. 6 shows the release sheet being peeled off the paper stock.

For a better understanding of the invention, reference is made to the drawings. In accordance with FIG. 1, the polyester base sheet 3 is coated with the light-hardenable, uncrosslinked photopolymer system 2 which, in turn, is overcoated with an optional oxygen barrier system 1. In FIG. 2, the exposure is made through the screened color separation negative 5 (emulsion down), optional oxygen barrier 1, light-hardenable photopolymer 2 and polyester base 3, in that order, using register pin 6. According to FIG. 3, the unhardened areas are developed away leaving the first color of the light-hardened polymer 4. In FIG. 4, the thermoplastic adhesive 8 is applied to a release sheet 9 and dried to remove solvent. FIG. 5 shows the adhesive carrying release sheet 9 being laminated to the desired paper stock 10 with heat and pressure. The composite is cooled and, in accordance with FIG. 6, the release sheet 9 is peeled away leaving the adhesive 8 on the selected paper stock 10. The light-hardened image 4 on the polyester support sheet 3 is then passed through a heated laminator 11 to the adhesive coated paper stock 13, using register pin 6, as shown in FIG. 7. After the composite is cooled to room temperature, the carrier sheet 3 is stripped away, as illustrated in FIG. 8, leaving the light-hardened photopolymer dots 4 embedded in the adhesive 8 of the adhesive/paper composite 13. A second, third, and fourth color is laminated in succession and in similar fashion to that shown in FIGS. 7 and 8. This results, ultimately, in a four-color proof.

In the specific embodiment of the present invention, as illustrated in the Figures, use is made of four light sensitive carrier sheets, each having a photosensitive layer of negative-acting photopolymer, which becomes insoluble to aqueous alkaline developer upon exposure to actinic light. The photosensitive layers contain coloring agents related to different primary colors: e.g. yellow, magenta, cyan, and black. The colored films are exposed to actinic light, through the appropriate color separation negative, either simultaneously or sequentially and then developed. The exposure and development processes can take as little as 7 minutes, producing image overlays that may be corrected individually, if needed, or viewed in four-color registry. The thermoplastic adhesive is applied on the image receiving receptor sheet once only and the colored images transferred, successively, by heat and pressure. Alternatively, the adhesive may be coated upon the image first to be transferred.

The present invention provides a process for transferring a series of semi-polymerized color images to an adhesive coated substrate using heat and pressure. Alternatively, the first image layer is adhesive coated. This process is accomplished because:

(a) the adhesive adheres preferentially to the final receptor stock, (b) the adhesion of the photopolymer dots comprising the image after transfer is greater to the adhesive than to the temporary support, (c) the softening, or glass transition temperatures of the partially cross-linked photopolymer image dots is within the softening range of the adhesive and both are sufficiently low to permit softening under heat and pressure followed by cooling, to result in the desired transfer while retaining a high degree of dimensional stability necessary for good registration.

It is believed that the light-struck photopolymer is partially crosslinked, but retains thermoplastic properties. Thus, both the adhesive and the light-struck photopolymer are thermoplastic. The photopolymer dots may be embedded in the adhesive at their softening temperature and held in place upon cooling. The compatibility and stability of the two systems insure the combined system against cohesive rupture and the latter shows excellent aging characteristics. Additionally, the molecular weight range of the adhesive should be such as to avoid too soft (non-aggressive, non-tacky) adhesion, or too hard (too stiff, non-tacky) adhesion at transfer conditions to accomplish the desired transfer.

The advantages of the present process are that it is fast and easy to carry out. It is also possible to correct individual colors in the overlay before transferring the images to a common receptor sheet. These image areas also are hard polymerized matter which do not have to be post-exposed to preserve dot integrity, do not deteriorate on aging, and may be transferred at the convenience of the user. Further, the proofer and the customer may see the transferred print on several possible paper choices before the press run is actually made.

EXPERIMENTAL

EXAMPLE I

Four light sensitive photopolymer solutions were prepared by mixing the following components in Ray-Sorb, Erlenmeyer flasks tinted to preserve light sensitive materials. Moderate stirring for about 1 hour with a magnetic stirrer was sufficient to effect complete solution:

| | | |
|---|---|---|
| 1. | Methyl Methacrylate/Methacrylic Acid Copolymer (85/15) (25% in Ethyl Cellosolve) (75.80 cps. ca. 30,000 M.W.) | 56.0 Grams |
| 2. | Hexyl diethylene glycol ether | 1.0 gram |
| 3. | Trimethylol ethane triacrylate | 16.0 grams |
| 4. | 2,3-dimethoxyphenyl quinoxaline | .55 gram |

12 grams of the above composite were combined with each of four pigment dispersions in the amount indicated:

1. 1.8 grams Royal Spectra Black Dispersion
2. 1.95 grams Yellow DGH 23 Dispersion
3. 2.6 grams Hostapink E Dispersion
4. 1.5 grams Permanent Blue 15-1020 Dispersion The dispersions used were prepared by American Hoechst's Pigment and Dyes Division and their composition and method of preparation are listed below:

Components are by weight, %, and in grams.

| Dispersion Components | Black | Yellow | Magenta | Cyan |
|---|---|---|---|---|
| Royal Spectra Black | 4.0 | | | |
| Yellow DGH | | 12.4 | | |
| Hostaperm Pink E | | | 11.0 | |
| Permanent Blue 15-1020 | | | | 12.3 |
| MMA/MAA Resin (30 M.W.) | 20.0 | 6.2 | 16.3 | 7.9 |
| Aerosol OT (75%) | | 1.3 | | |
| Ganex P 904 | 1.0 | | .8 | .8 |
| Monopole Oil 48 | 1.0 | | | |
| Ethyl Cellosolve | 74.0 | 80.1 | 71.9 | 79.0 |

Procedure:

1. The pigment was wetted out in ethyl cellosolve with a small amount of surfactant.

2. A 35% solution of the P (MMA/MAA) resin in ethyl cellosolve was added for the proper pigment to binder ratio.

3. More ethyl cellosolve was added, as necessary, for proper grind consistency.

4. The mix was then ground on a Red Devil "Quickie" mill for a satisfactory grind gauge reading (ca. 30 sec.).

5. The resultant buttery mix was milled further and thinned with solvent until it would screen freely through a gauze cone.

The combination of binder system and pigment dispersion formed a complete coating.

Coatings corresponding to each pigment color were cast on a 3 mil sheet of Mylar polyester film with a #12 Mier rod and dried at 100° C. in an air oven. The drying schedule was found to be somewhat critical at 100° C. to prevent picking of the coating during exposure and at the same time prevent loss of initiator due to the thermal drying treatment. The following drying schedules were found suitable:

| Coating | Time at 100° C. |
| --- | --- |
| Black | 7 min. |
| Yellow | 7 min. |
| Magenta | 7 min. |
| Cyan | 9 min. |

Coating weights were found to be about 4.6 g/m². The four pigmented coatings were exposed in a Nu Arc Platemaker exposure unit in pin register through the appropriate color negative. The negative was placed on the polyester support side of the composite so as to achieve images of the correct perspective for subsequent transfer. Exposure time was 1 unit (3 min. 17 sec.) and each coating was developed with NAPS Developer (American Hoechst Corporation) in 20–30 seconds.

Stepwedges of 5 ghosting to 7 were obtained for black and yellow and 7 ghosting to 9 were obtained for magenta and cyan. The four images on the transparent polyester base, Melinex 0, were superposed in register to make an overlay proof. The densities of the four colors were as follows:

| Color Filter | Cyan Red | Magenta Green | Yellow Blue | Black |
| --- | --- | --- | --- | --- |
| | | REFLECTANCE DENSITY | | |
| Overlay, 4 layer | 0.98 | 1.03 | 0.7 | 1.6 |
| Surprint, after transfer | 1.15 | 1.20 | 0.74 | 1.8 |

The hues were found to match the PMS colors closely. The dot size of the individual colors corresponded closely to the respective separation negative. Thus, dot fidelity was preserved in the overlay rendition. Dot fidelity was preserved during transfer to form the surprint which possesses the known expected advantages of a surprint. The use of the photopolymer compositions of this invention gives one the advantages of both overlay and surprint proofing systems using the same color images.

Overlay Image Transfer

A sheet of bonded printing paper was selected at random and coated (#12 Mier rod) with a 30% solids aqueous dispersion of a 0.5% oxalic acid catalyzed thermosetting acrylic latex (Union Carbide UCAR-874). The treated paper was cured 2' at 150° C. in an air oven and was effectively sealed yet not rigid. The sealed sheet was then top coated with a 25% solution of a methyl methacrylate/methacrylic acid resin adhesive (24.5 cps) in ethyl cellosolve to a coating weight of 20.8 g/m². The coating was dried to touch in about 40 seconds in a 100° air oven.

Transfers of the overlay image to the receptor sheet were carried out by mounting the overlay, image side down, on the adhesive coated receptor sheet, with pin registry, and passing the composite through a DuPont C.T.F. laminator, at pressures of about 20–25 psi and a roll temperature of 220°–230° F. The polyester sheet was next to the hot roll and the total composite moved through the laminator at about 5"/min. The composite was then cooled to ambient temperature before stripping the polyester sheet.

Each color was superimposed on the other on the receptor sheet in similar fashion until all four colors had been transferred. The order of transfer in this case was black down first, yellow next, magenta, and finally cyan, but this is not considered critical and is at the option of the user. Complete dot transfer was obtained with no visible curtailment of the image rendition from the overlay to the print.

EXAMPLE II

The following formulation was stirred to complete solution and then mixed with the pigment dispersions in the same manner and in the same ratio as indicated in Example I:

| 1. | Methyl Methacrylate/Methacrylic Acid Copolymer 78 cps. 30,000 M.W. 85/15 (25% in Ethyl Cellosolve) | 56.0 grams |
| --- | --- | --- |
| 2. | Polyethylene Glycol Diacrylate (400) | 6.0 grams |
| 3. | 9 phenyl Acridine | .2 gram |

The pigment dispersed coatings were applied at 3 mil., Melinex 0 polyester sheets (Imperial Chemical Industries, Ltd.) at a coating weight of about 4.4 g/m². The coatings were dried 2' at 60° C. and were found to be non-tacky to the touch. A top coating of a water solution of polyvinylalcohol (Elvanol 52-22-E. I. duPont de Nemours-25 g/l, Duponal R.A.-12.5 g/l, Formaldehyde (30%)-28.0 g/l) was applied over the dried photopolymer coating at a coating weight of about 0.2–0.3 g/m² and dried for 2' at 60° C.

The four colored foils were then exposed through the appropriate negatives placed on the support film side of the composite and exposed for the following time schedule:

| Black | ⅜ Nu Arc Unit |
| --- | --- |
| Yellow | ⅜ Nu Arc Unit |
| Magenta | ¼ Nu Arc Unit |
| Cyan | ¼ Nu Arc Unit |

The exposed coatings were developed as shown in Example I and clear, well-adhered images were obtained with stepwedges of 5 ghosting to 7 for all colors.

Preparation of Receptor Sheet

A siliconized release sheet was coated with a 35% solution of Acryloid B-48 N (in toluene) to a coating weight of about 20.0 g/m². The coating was dried for 2 minutes at 100° C. in an air oven.

A sample of bonded printing paper was then selected at random from stock and mated with the adhesive side of the release sheet. A pressing iron was heated to 225°

F. and passed over the paper surface one to two times with moderate pressure and cooled to room temperature. The release sheet was then stripped leaving the adhesive film on the surface of the paper with minimum "strike-in" but good adhesion to the surface.

Transfer

In a manner similar to that described in Example I, all four colors were superimposed in register to give a full color proof.

EXAMPLE III

In a manner similar to Example I, the following formulation was prepared and stirred to solution. As also previously indicated, the parent coating media was pigmented in the ratios indicated and these were stirred to excellent dispersion in about 15 minutes:

| 1. | Methyl Methacrylate/Methacrylic Acid Copolymer 85/15 25% solution in Ethyl Cellosolve (78 cps. 30,000 M.W.) | 56.0 grams |
|----|---|---|
| 2. | Ethoxylated Bisphenol A | 10.00 grams |
| 3. | 2,3-dimethoxy phenyl quinoxaline | .2 gram |

The pigmented coating media were laid on 3 mil polyester support sheets, dried, top-coated with PVA, dried, exposed, and developed as indicated in Example II. Step wedges of 3 ghosting to 5 were obtained in all cases.

Transfers were made, as in Example I, with no difficulty.

EXAMPLE IV

A further example of this disclosure was formulated and stirred to solution as in Example I:

| 1. | Methyl Methacrylate/Methacrylic Acid 85/15 25% solution in Ethyl Cellosolve (24.5 cps.) | 56.0 grams |
|----|---|---|
| 2. | Trimethylol ethane triacrylate | 16.0 grams |
| 3. | Hexyl diethylene glycol ether | 1.0 gram |
| 4. | 2,3-dimethoxy phenyl quinoxaline | .55 gram |

Again, the pigmentation ratios for the dispersions and stirring procedures were followed as in Example I. PVA top coating procedures, exposure procedures, and development procedures were used as in Example II, except that the clear but slightly tacky coatings that were obtained were exposed on release paper to avoid picking.

Mark I Cover Sheets, obtained from J & B Papers, are supplied with a lacquer coating to obtain a high gloss, high quality printing paper. A sample of this paper was coated with 20,000 molecular weight MMA/MAA copolymer used in the coating formulation at a coating weight of 20 g/m² and dried for 2′ at 100° C.

Image transfers were made in the CTF laminator at temperatures as low as 200° F., but with simultaneous increases in pressure to 35-40 psi. At 250° F. transfer temperature, the roll pressure could be reduced to about 15 psi.

EXAMPLE V

As in Example I, another thermoplastic photopolymerizable composition was made from the following components and stirred to complete solution:

| 1. | Styrene/Maleic Acid Copolymer 80/20 20% solids in MEK (250 cps) | 70.0 grams |
|----|---|---|

-continued

| 2. | Hexyl diethylene glycol ether | 1.0 gram |
|----|---|---|
| 3. | Trimethylol ether triacrylate | 14.0 grams |
| 4. | 2,3-dimethoxy phenyl quinoxaline | .2 gram |

In a similar manner to Example II, the 12.0 gram portions of the mix were pigmented, coated on 3 mil Melinex polyester film, dried, top coated with PVA, exposed and developed. Step wedges of 7 ghosting to 9 were obtained in each case and the images had good clarity.

Transfers were made by coating a Mark I cover sheet with an MMA/MAA 85/15 copolymer. The copolymer had a 250 cps viscosity at 25% solids.

In this example, a 60% solids clear flux of the copolymer in ethyl cellosolve was made by stirring at 70° C. A sample of the flux was removed and a bead was made of the flux and placed across one end of a bonded sheet of printing paper. This was covered by a release sheet and the composite was run through the laminator at 230°-240° F. and sufficient roll pressure to produce a thin coating. The coating was allowed to cool and the release sheet stripped. A 0.75-1.0 mil coating was obtained with the bulk of the coating on the surface.

Suitable image transfers were brought about by transferring the images at 250°-260° F. and 35-40 psi as in Example I.

EXAMPLE VI

A thermoplastic photopolymerizable composition was made from the following components and stirred to solution in about one hour.

| 1. | Methyl methacrylate/Ethyl acrylate/Methacrylic Acid 75/10/15 (25% ethyl cellosolve - 58 cps) | 56.0 grams |
|----|---|---|
| 2. | Trimethylol ethane triacrylate | 8.0 grams |
| 3. | Hexyl diethylene glycol ether | 1.0 gram |
| 4. | 2,3-dimethoxy phenyl quinoxaline | .2 gram |

All four colors were prepared as in Example I, and were coated on 3 mil Melinex O film, dried, PVA top coated, dried, exposed, and developed as in Example II.

Step wedges of 6 ghosting to 8 were obtained and these overlays were found to have exceptionally good adhesion to the polyester support.

25% adhesive solutions were made from the terpolymer used in the photopolymerizable composition above and from an MMA/EA/MAA 65/20/15 terpolymer. These were coated on Mark I cover sheeting at a dry coating weight of about 20.0 g/m² and dried for 2′ in a 100° C. oven.

An electrically heated hand roller (Emerald Film Systems) was used to make the transfers. In the case of the 75/10/15 terpolymer, the transfers were made at 290°-300° F. and heavy hand pressure on the roller. The 65/20/15 terpolymer transferred the images at about 270° F. and with heavy hand pressure.

EXAMPLE VII

A thermoplastic photopolymerizable composition based on dyes was made from the following components:

| Component | (All quantities are in grams) | | | |
|---|---|---|---|---|
| | Cyan | Yellow | Magenta | Black |
| Methyl Methacrylate/Methacrylic Acid Copolymer (25% solids 78 cps) | 56.0 | 56.0 | 56.0 | 56.0 |
| Oxyethyl methacrylate with 2,2,4-trimethylene diisocyanate (2,2,4-trimethylene diisocyanate diethyl methacrylate) | 9.5 | 9.0 | 10.0 | 11.0 |
| 9-Phenyl acridine | .4 | .7 | .6 | .8 |
| Irganox 1076 | .1 | .2 | — | .1 |
| Victoria Pure Blue FGA Dye (BASF) | .37 | .01 | — | .27 |
| Auramin FWA Dye (BASF) | — | .6 | — | .8 |
| Rhodamine 6 GDN Extra (Dupont) | — | .02 | .3 | .3 |
| Neozapon Fiery Red G (BASF) | — | — | .2 | — |
| Interplast Pink 5 BLG (Intracolor) | — | — | .3 | — |

The entire composition was stirred for about 1 hour to effect maximum solution of the components and then each system was filtered to remove unwanted sediment. The formulations were then coated on polyester film (ICI's Melinex 0) at a coating weight of 6.8–7.2 g/m² and dried for 2' at 60° C.

All four photosensitive coatings were exposed for ½ unit in the Nu Arc exposure equipment. As in Example I, the negatives were placed on the film support side and the photopolymer exposed through the support film.

An alkaline developer, EN-11, supplied by Kalle AG, was used and images with step wedges of 6 ghosting to 8 were obtained.

The receptor sheet was prepared for transfer as in Example II and processed through the laminator as in Example I. Four color proofs were obtained with excellent dot rendition.

EXAMPLE VIII

The following photopolymerizable system, also based on dyes, was prepared as indicated in Example VII.

| Component | (All quantities are in grams) | | | |
|---|---|---|---|---|
| | Cyan | Yellow | Magenta | Black |
| Methacrylic acid/styrene/hexyl methacrylate (28/22/50) 26% solids in MEK | 54.0 | 54.0 | 54.0 | 54.0 |
| Polyethylene glycol diacrylate 400 | 3.75 | 3.75 | 3.75 | 3.75 |
| Trimethylol Propane Triacrylate | 1.25 | 1.25 | 1.25 | 1.25 |
| 9 Phenyl Acridine | .6 | .6 | .6 | .6 |
| Victoria Pure Blue (FGA Dye - BASF) | .093 | — | — | — |
| Sudan Yellow Dye (Kalle) | — | .367 | — | — |
| Auramine 0 Dye (BASF) | — | .127 | — | — |
| Interplast Pink 5 BLG (Intracolor) | — | — | .044 | — |
| Rhodamine 6 GDN-Extra (Dupont) | — | — | .2 | — |
| Black Dispersion (Example I) | — | — | — | 8.8 |

It was found most convenient to dissolve the dyes in methyl cellosolve according to the following concentrations:

| Victoria Pure Blue Dye | 1.5 g/100 grams, M.C. |
|---|---|
| Sudan Yellow | 5.0 g/100 grams, M.C. |
| Auramine 0 | 2.6 g/100 grams, M.C. |
| Interplast Pink 5 BLG | .6 g/100 grams, M.C. |
| Rhodamine 6 GDN | 4.2 g/100 grams, M.C. |

These solutions were filtered and added to the formulation in the amounts shown. The formulations were then coated on polyester film (I.C.I.'s Melinex 0), at a coating weight of about 9.2 g/m² and dried for 2' at 140° C.

All four photosensitive coatings were exposed for ⅓ of a Nu Arc unit through the appropriate negative placed on the film support side of the coated carrier film.

An alkaline developer, EN-11, supplied by Kalle AG, was used and images with step wedges of solid 4 ghosting to 7 were obtained.

A Mark I cover sheet, as described in Example IV, was coated with Acryloid B-48 N adhesive (Rohm & Haas) to a dry coating weight of about 20 g/m² and dried for 15 minutes in a 60° C. hot air oven and then 2 hours in a 100° C. hot air oven.

The developed images and receptor sheets were mated and images transferred through the CTF laminator as in Example I.

Four color proofs were obtained with excellent dot rendition.

EXAMPLE IX

The following thermoplastic photopolymerizable compositions were prepared and stirred for about 1 hour. The pigment dispersions are those given before in Example I.

| Component | (All quantities are in grams) | | | |
|---|---|---|---|---|
| | 1 | 2 | 3 | 4 |
| Methacrylic acid styrene/hexyl methacrylate (30/10/60) 26% solids in MEK | 54.4 | 54.4 | 54.4 | 54.4 |
| Polyethylene glycol diacrylate 400 | 6.0 | 4.25 | 4.25 | 4.25 |
| 9 Phenyl acridine | .2 | .2 | .2 | .2 |
| Black dispersion | 9.08 | — | — | — |
| Yellow dispersion | — | 7.4 | — | — |
| Magenta dispersion | — | — | 7.9 | — |
| Cyan dispersion | — | — | — | 4.93 |

All four colors were coated on 3 mil polyester film (Melinex 0) at a coating weight of 9.5 g/m², dried for 2' at 60° C. and exposed for ½ unit in the Nu Arc exposure unit.

The exposed films were developed with the alkaline developer as in Example I and step wedges of 5 ghosting to 8 were obtained.

Four color transfers were prepared by applying Acryloid B-48 N adhesive to the Mark I cover sheet as shown in Example II and the transfer process was carried out as in Example I.

Complete image transfer was obtained and dot retention was excellent.

EXAMPLE X

The following thermoplastic photopolymerizable compositions were prepared and stirred to complete solution in about 1 hour. Dispersions are those previously given in Example I.

| Component | (All quantities are in grams) | | | |
|---|---|---|---|---|
| | 1 | 2 | 3 | 4 |
| Hexyl methacrylate/styrene/methacrylic acid (55.6/12.7/31.7) Acid No. 190 - 26% solids in MEK | 54.4 | 54.4 | 54.4 | 54.4 |

-continued

| Component | (All quantities are in grams) | | | |
|---|---|---|---|---|
| | 1 | 2 | 3 | 4 |
| Polyethylene glycol diacrylate 400 | 4.25 | 4.25 | 4.25 | 4.25 |
| 9 Phenyl Acridine | 0.5 | 0.5 | 0.5 | 0.5 |
| Black dispersion | 9.08 | — | — | — |
| Yellow dispersion | — | 7.4 | — | — |
| Magenta dispersion | — | — | 7.4 | — |
| Cyan dispersion | — | — | — | 7.4 |

Each color was coated on 3 mil polyester film (Melinex 0) at a coating weight of 9.2 g/m², dried for 2' at 60° C., and exposed for ⅓ unit for black and ½ unit for yellow, magenta, and cyan.

Four color transfers were prepared, again, by applying Acryloid B-48 N adhesive to the Mark I cover sheet as in Example II and carrying out the transfer as in Example I.

Complete image transfer was obtained with excellent dot rendition.

EXAMPLE XI

The following formulation was prepared and pigmented as described in Example I:

| | |
|---|---|
| Methyl methacrylate/Methacrylic acid copolymer 85/15 25% solution in ethyl cellosolve | 56.0 grams |
| Polyethylene glycol diacrylate (400) | 10.0 grams |
| 2,3-dimethoxy phenyl quinoxaline | 0.2 gram |

The pigmented systems were applied to 3 mil (Melinex 0) polyester film and dried in a 60° C. air oven for 2'. A dry coating weight of 4.5 g/m² was obtained.

The coatings were then covered with another sheet of Melinex 0 polyester film and exposed for ½ Nu Arc unit through the carrier sheet. The cover sheet was removed and attempts were made to transfer the unexposed images to bonded printing paper by means of hot transfer in the DuPont CTF laminator.

The unexposed portions of the images could only be partially transferred at 225° C. and at usual laminator pressures (15–20 psi).

EXAMPLE XII

The following photopolymerizable system, also based on dyes, was prepared as indicated in Example VII. All quantities are in grams.

| Component | Cyan | Yellow | Magenta | Black |
|---|---|---|---|---|
| Methacrylic acid/styrene/hexyl methacrylate (28/22/50) 25% solids in MEK | 56.0 | 56.0 | 56.0 | 56.0 |
| Polyethylene glycol diacrylate 400 | 3.75 | 3.75 | 3.75 | 2.80 |
| Trimethylol Propane Triacrylate | 1.25 | 1.25 | 1.25 | .95 |
| 9 Phenyl Acridine | .6 | .6 | .6 | 1.25 |
| Victoria Pure Blue (FGA Dye - BASF) | .093 | — | — | — |
| Interplast Pink 5 BLG (Intracolor) | — | — | .044 | — |
| Rhodamine 6 GDN Extra (Dupont) | — | — | .2 | — |
| Black Dispersion (Example I) | — | — | — | 15.4 |
| Spirit Soluble Fast Yellow "A" (BASF) | — | .51 | — | — |
| Trimethyl propane Trimethacrylate | — | — | — | 3.75 |

It was found most convenient to dissolve the dyes in methyl cellosolve according to the following concentrations:

| | |
|---|---|
| Victoria Pure Blue Dye | 1.5 g/100 grams, M.C. |
| Spirit Soluble Fast Yellow "A" | 7.0 g/100 grams, M.C. |
| Auramine 0 | 2.6 g/100 grams, M.C. |
| Interplast Pink 5 BLG | .6 g/100 grams, M.C. |
| Rhodamine 6 GDN | 4.2 g/100 grams, M.C. |

These solutions were filtered and added to the formulation in the amounts shown. The formulations were then coated on polyester film (I.C.I.'s Melinex 0), at a coating weight of about 9.2 g/m² and dried for 2' at 140° C.

All four photosensitive coatings were exposed for ⅓ of a Nu Arc unit through the appropriate negative placed on the film support side of the coated carrier film.

An alkaline developer, EN-11, supplied by Kalle AG, was used and images with step wedges of solid 4 ghosting to 7 were obtained.

A Mark I cover sheet, as described in Example IV, was coated with Acryloid B-48 N adhesive (Rohm & Haas) to a dry coating weight of about 20 g/m² and dried for 15 minutes in a 60° C. hot air oven and then 2 hours in a 100° C. hot air oven.

The developed images and receptor sheets were mated and images transferred through the CTF laminator as in Example I. Four color proofs were obtained with excellent dot rendition.

It should be understood that, while the examples refer to paper receptor sheets, plastic, plastic/paper laminates, metal foils and other combinations may also be utilized. Particularly, suitable receptor sheets may be the same types used as carrier support, such as thin films of polyethylene terephthalate, copolymers and terpolymers of methyl methacrylate, modified celluloses, 6,6 Nylon, 6,12 Nylon, 6 Nylon, polyvinyl acetates and alcohols, etc.

It should also be understood that the adhesive may be applied to the imaged support sheet prior to transfer of the image areas to the receptor sheet.

The adhesive may be applied to the imaged support sheet by the transfer coating technique previously described. However, other suitable methods of applying adhesive to the imaged support sheet, or to the receptor sheet, prior to transfer of the image areas to the receptor sheet may also be practiced. Reference is made to U.S. Pat. No. 3,721,557, which discloses a number of suitable techniques.

It will be obvious to those skilled in the art that many modifications may be made within the scope of the present invention without departing from the spirit thereof and the invention includes such modifications.

What is claimed is:

1. A method of making a multicolored reproduction consisting essentially of exposing a single photopolymerizable layer comprising a mixture of at least one macromolecular binder with pendant acid groups and a first preselected color on a support sheet to light through a color separation negative for said first color, treating the exposed layer with a developing solution and removing the non-light-struck, non-image areas of said layer while leaving said light-struck image areas of said layer on said support sheet, transferring said image areas by contacting said image areas on said support sheet with a receptor sheet, one of said support sheet with image areas thereon or said receptor sheet having a layer of transparent to slightly translucent hot melt adhesive thereon comprising an acrylic polymer or copolymer, said transfer being effected at a temperature sufficient to soften said adhesive and said image areas, and under a pressure sufficient to adhere said image areas to said receptor sheet, removing said support sheet, and repeating the steps at least once of exposing a single photopolymerizable layer, of one other preselected color, treating said layer with a developing solution, and transferring said image areas of said layer to said receptor sheet without additional adhesive to superimpose the image areas of said other color directly onto said receptor sheet carrying said image areas of said layer of said first color.

2. A method in accordance with claim 1 wherein the photopolymerizable layers contain: (a) at least one multi-functional, unsaturated compound capable of forming a polymer by addition polymerization; and (b) an addition polymerization initiator activated by radiation.

3. A method in accordance with claim 2 wherein the photopolymerizable layers additionally contain a hydrogen donor.

4. A method in accordance with claim 1 wherein the photopolymerizable layers are colored with a pigment.

5. A method in accordance with claim 1 wherein the photopolymerizable layers are colored with a dye.

6. A method in accordance with claim 1 wherein the receptor sheet is paper.

7. A method in accordance with claim 1 wherein the receptor sheet is a plastic.

8. A method in accordance with claim 1 wherein the receptor sheet is a plastic-paper laminate.

9. A method in accordance with claim 1 wherein the receptor sheet is a metal foil.

10. A method in accordance with claim 1 wherein the receptor sheet is coated with a single layer of the adhesive prior to contact with the image areas of the layer of the first color only.

11. A method in accordance with claim 1 wherein the side of the support sheet carrying the light-struck, image areas of the layer of the first color only is coated with a single layer of the adhesive prior to contact with the receptor sheet.

12. A method in accordance with claim 1 wherein each of the photopolymerizable layers is overcoated with a single, oxygen barrier layer soluble in the developing solution.

13. A method in accordance with claim 12 wherein the oxygen barrier layer is polyvinyl alcohol.

* * * * *